US009350304B2

(12) United States Patent
Huang et al.

(10) Patent No.: US 9,350,304 B2
(45) Date of Patent: May 24, 2016

(54) QUIESCENT CURRENT EQUALIZATION METHOD, OUTPUT STAGE CIRCUIT, CLASS AB AMPLIFIER AND ELECTRONIC DEVICE

(71) Applicant: Fairchild Semiconductor Corporation, San Jose, CA (US)

(72) Inventors: Lei Huang, Beijing (CN); Peng Yanhao, Beijing (CN)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 14/315,663

(22) Filed: Jun. 26, 2014

(65) Prior Publication Data

US 2015/0002231 A1 Jan. 1, 2015

(30) Foreign Application Priority Data

Jun. 27, 2013 (CN) .......................... 2013 1 0275012

(51) Int. Cl.

*H03F 3/21* (2006.01)
*H03F 3/45* (2006.01)
*H03F 3/345* (2006.01)
*H03F 1/30* (2006.01)

(52) U.S. Cl.

CPC ................ *H03F 3/345* (2013.01); *H03F 1/301* (2013.01)

(58) Field of Classification Search

USPC .......................... 330/296, 255, 262, 267, 270
See application file for complete search history.

(56) References Cited

U.S. PATENT DOCUMENTS 8,193,862 B2 * 6/2012 Adachi ......................... 330/255

* cited by examiner

*Primary Examiner* — Hieu Nguyen
(74) *Attorney, Agent, or Firm* — Grossman Tucker Perreault & Pfleger PLLC

(57) ABSTRACT

An output stage circuit is provided, which includes a power supply, a quiescent current control circuit, an output circuit, and a quiescent current equalization circuit. The quiescent current equalization circuit is configured to decrease or increase a quiescent current flowing through a quiescent current biasing circuit in the quiescent current control circuit when a change of a voltage of the power supply is detected, such that a quiescent current flowing through the output circuit remains constant. A quiescent current equalization method, a Class AB amplifier and an electronic device are also provided. When the voltage of the power supply is increased, the quiescent current of the output circuit of the output stage circuit can maintain constant. As such, the power supply rejection ratio (PSRR) of the output circuit can be efficiently increased and the power consumption of the device can be reduced.

15 Claims, 4 Drawing Sheets

31 33 321 331 333 332 34 P5 P1 I2 V1 I1 P2 P6 P4 N3 P3 N6 N2 N4 V0 N5 I0 I3 N1 322 VSS

PRIOR ART

QUIESCENT CURRENT EQUALIZATION METHOD, OUTPUT STAGE CIRCUIT, CLASS AB AMPLIFIER AND ELECTRONIC DEVICE

PRIORITY

The present non-provisional U.S. patent application claims the benefit under 35 U.S.C. §119 of Chinese Patent Application No. 201310275012.0 entitled, "Quiescent Current Equalization Method, Output Stage Circuit, Class AB Amplifier and Electronic Device" that was originally filed on Jun. 27, 2013. The contents of the above-identified foreign patent application are incorporated herein, in entirety, by reference.

TECHNICAL FIELD

The disclosure relates to technology for an output stage circuit of an amplifier, and in particular to a quiescent current equalization method, an output stage circuit, a Class AB amplifier and an electronic device.

BACKGROUND

An amplifier is a device with which a voltage or power of an input signal can be amplified. Among various types of amplifiers, Class AB amplifiers are advantageous in high efficiency, relatively low distortion, relatively low energy consumption of power amplifier transistors and good heat dissipation. At present, such amplifiers are widely used.

FIG. 1 is a schematic diagram of an output stage circuit of a conventional Class AB amplifier. As shown in FIG. 1, when the voltage of the power supply VCC is increased, due to a channel-length modulation effect, the quiescent current flowing through an output circuit, i.e. MP1 and MN1, of the output stage circuit will be increased. As such, the power supply rejection ratio (PSRR) of the output circuit will be decreased and the power consumption of the device will be increased.

SUMMARY

In view of the above, the disclosure provides a quiescent current equalization method, an output stage circuit, a Class AB amplifier and an electronic device.

In an embodiment, an output stage circuit is provided. The output stage circuit includes a power supply, a quiescent current control circuit, an output circuit, and a quiescent current equalization circuit. The quiescent current equalization circuit is configured to decrease or increase a quiescent current flowing through a quiescent current biasing circuit in the quiescent current control circuit when a change of a voltage of the power supply is detected, such that a quiescent current flowing through the output circuit remains constant.

In an embodiment, a quiescent current equalization method is provided. The method includes: detecting a change of a voltage of a power supply; and decreasing or increasing a quiescent current flowing through a quiescent current biasing circuit in a quiescent current control circuit upon detection of the change of the voltage of the power supply, such that a quiescent current flowing through an output circuit remains constant.

In an embodiment, a Class AB amplifier is provided. The Class AB amplifier includes an output stage circuit, which includes a power supply, a quiescent current control circuit, an output circuit, and a quiescent current equalization circuit. The quiescent current equalization circuit is configured to decrease or increase a quiescent current flowing through a quiescent current biasing circuit in the quiescent current control circuit when a change of a voltage of the power supply is detected, such that a quiescent current flowing through the output circuit remains constant.

In an embodiment, an electronic device is provided. The electronic device includes a motherboard, a casing and a Class AB amplifier, which includes an output stage circuit, the output stage circuit including: a power supply, a quiescent current control circuit, an output circuit, and a quiescent current equalization circuit. The quiescent current equalization circuit is configured to decrease or increase a quiescent current flowing through a quiescent current biasing circuit in the quiescent current control circuit when a change of a voltage of the power supply is detected, such that a quiescent current flowing through the output circuit remains constant.

With respect to the quiescent current equalization method, the output stage circuit, the Class AB amplifier and the electronic device provided by the disclosure, when a change of the voltage of the power supply is detected, the quiescent current flowing through the quiescent current biasing circuit in the quiescent current control circuit is decreased or increased, such that the quiescent current flowing through the output circuit remains constant. When the voltage of the power supply is increased, the quiescent current of the output circuit of the output stage circuit can maintain constant. As such, the PSRR of the output circuit can be increased and the power consumption of the device can be decreased effectively.

Furthermore, when the voltage of the power supply is increased, the drain-source voltage of the metal oxide semiconductor field effect transistor (MOS) in the quiescent current equalization circuit is increased, causing the quiescent current flowing through the static biasing circuit of the quiescent current control circuit to be decreased, such that the quiescent current flowing through the output circuit remains constant. As such, when the voltage of the power supply is increased, the quiescent current flowing through the output circuit of the output stage circuit can maintain constant effectively. In this way, the PSRR of the output circuit can be increased and the power consumption of the device can be decreased effectively.

Additionally, the technical solutions provided by the disclosure are simple, convenient and easy to carry out and can be applied to various devices having different power supply voltages.

DETAILED DESCRIPTION

Figure 1:
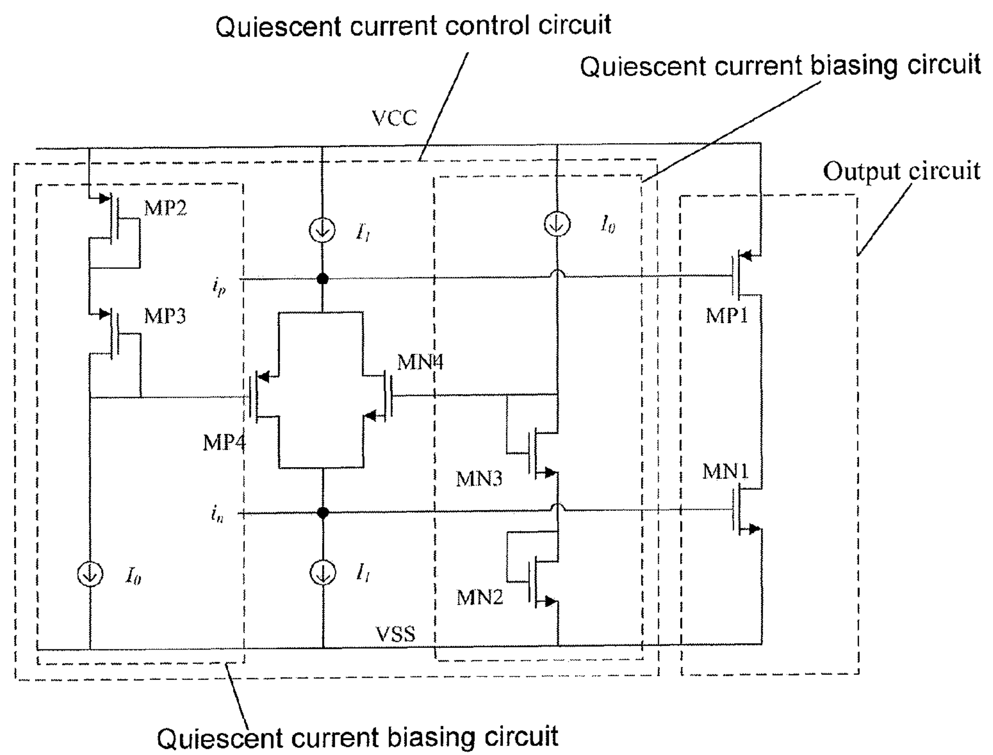
FIG. 1 is a schematic diagram of the structure of an output stage circuit of a conventional Class AB amplifier.

Generally, an output stage circuit of a conventional Class AB amplifier, if being divided by functions, includes a quiescent current control circuit and an output circuit. As shown in FIG. 1, the quiescent current control circuit is configured to control the quiescent current of the output circuit and result in a Class AB operation mode. As used herein, the quiescent current control circuit comprises transistors MP2, MP3, MP4, MN2, MN3 and MN4, two first current reference sources $I_0$ and two second current reference sources $I_1$; the output circuit comprises transistors MP1 and MN1. In the Class AB operation mode, the quiescent current flowing through the output circuit is relatively small in the quiescent state, while in the dynamic state, a relatively large current can be output to the load, and a relatively high output efficiency and a relatively small crossover distortion can be achieved.

If being divided by the MOS types used, as shown in FIG. 1, the output stage circuit of the conventional Class AB amplifier may comprise a first circuit which is comprised of four P-channel metal oxide semiconductor field effect transistors (PMOS) (i.e. MP1, MP2, MP3 and MP4), a first current reference source $I_0$ and a second current reference source $I_1$, and a second circuit which is comprised of four N-channel metal oxide semiconductor field effect transistors (NMOS) (i.e. MN1, MN2, MN3 and MN4), a first current reference source $I_0$ and a second current source $I_1$; where both the first circuit and the second circuit comprise a quiescent current biasing circuit; the quiescent current biasing circuit of the first circuit comprises MP2, MP3 and the first current reference source $I_0$, and the quiescent current biasing circuit of the second circuit comprises MN2, MN3 and the first current reference source $I_0$. As used herein, the quiescent current biasing circuit is configured to generate a bias for the quiescent current of the output circuit such that the quiescent current flowing through the output circuit becomes a mirror of the quiescent current flowing through the quiescent current biasing circuit itself.

Taking the first circuit as an example, the principle of the quiescent current size flowing through the output circuit of the output stage circuit of the conventional Class AB amplifier will be described below.

As illustrated in FIG. 1, in the output stage circuit of the conventional Class AB amplifier, $V_{gSMP1}+V_{gsMP4}=V_{gSMP2}+V_{gsMP3}$; where $V_{gSMP1}$ represents the gate-source voltage of MP1, $V_{gsMP4}$ represents the gate-source voltage of MP4, $V_{gSMP2}$ represents the gate-source voltage of MP2, $V_{gsMP3}$ represents the gate-source voltage of MP3; and MP1 and MP2 have an identical finger size, MP3 and MP4 have an identical finger size. Therefore, the quiescent current flowing through MP1 will be N times of the value of the quiescent current flowing through MP2, wherein N represents the ratio of the number of fingers of MP1 to the number of fingers of MP2. As used herein, MP1 and MP2 having an identical finger size means that MP1 and MP2 are of a finger structure, and the width-to-length ratio for each finger of MP1 is as same as that of MP2.

The principle of the second circuit is the same as the principle of the first circuit and thus will not be described in detail.

Accordingly, in an ideal case, the quiescent current flowing through the output circuit is N times the quiescent current flowing through the quiescent current biasing circuit. When the value of N is determined, the quiescent current flowing through the output circuit will be a constant number times the quiescent current flowing through the quiescent current biasing circuit. In other words, the quiescent current flowing through the output circuit will maintain constant. As used herein, the quiescent current biasing circuit may be the quiescent current biasing circuit of the first circuit or the quiescent current biasing circuit of the second circuit.

Figure 2:
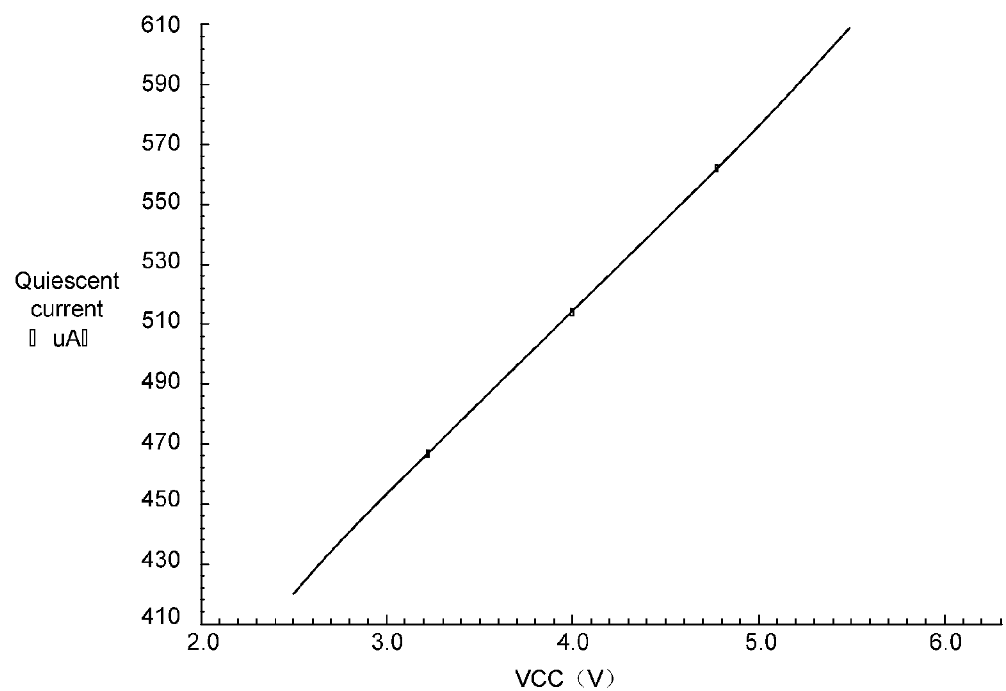
FIG. 2 is a schematic diagram of the simulation result of an existing technical solution.

However, as shown in FIG. 2, due to the channel-length modulation effect, the quiescent current flowing through the output circuit would become greater with increasing of the voltage of the power supply VCC. A simulation result shows that, when the voltage of the power supply VCC was increased from 2.5 V up to 5.5 V, the quiescent current flowing through the output circuit was increased from 418 μA up to 610 μA. Compared with the quiescent current flowing through the output circuit when the voltage of the power supply was 2.5 V, the quiescent current flowing through the output circuit was increased by about 50% when the voltage of the power supply was 5.5 V.

The increasing of the quiescent current flowing through the output circuit with the increasing of the voltage of the power supply VCC caused by the channel-length modulation effect is primarily reflected by the following:

1. In the output stage circuit of the conventional Class AB amplifier, since $V_{dsMP1}+V_{dsMN1}=V_{VCC}$, when the voltage of the power supply VCC is changed, $V_{dsMP1}+V_{dsMN1}$ will also be changed, where $V_{dsMP1}$ represents the drain-source voltage of MP1, $V_{dsMN1}$ represents the drain-source voltage of MN1, $V_{VCC}$ represents the voltage of the power supply VCC. Therefore, due to the channel-length modulation effect, when the voltage of the power supply VCC is changed, the drain-source voltage of the output circuit will be mismatched such that the ratio of the quiescent current flowing through the output circuit to the quiescent current flowing through the quiescent current biasing circuit is no longer a constant value, i.e. the quiescent current flowing through the output circuit is no longer constant but would be varied. As used herein, the quiescent current biasing circuit may be the quiescent current biasing circuit of the first circuit or the quiescent current biasing circuit of the second circuit.

2. In the output stage circuit of the conventional Class AB amplifier, when the voltage of the power supply VCC is increased, due to the channel-length modulation effect, the drain-source voltage $V_{dsI0}$ of the first current reference source $I_0$ will be increased such that the quiescent current of the first current reference source $I_0$ will be increased and accordingly the quiescent current flowing through the output circuit will be increased significantly.

Accordingly, the basic idea of the disclosure is: when a change of the voltage of a power supply is detected, the quiescent current flowing through the quiescent current biasing circuit of the quiescent current control circuit is decreased or increased, such that the quiescent current flowing through the output circuit remains constant.

The subject matter will be further described in detail by referring to the accompanying drawings and the particular embodiments.

Figure 3:
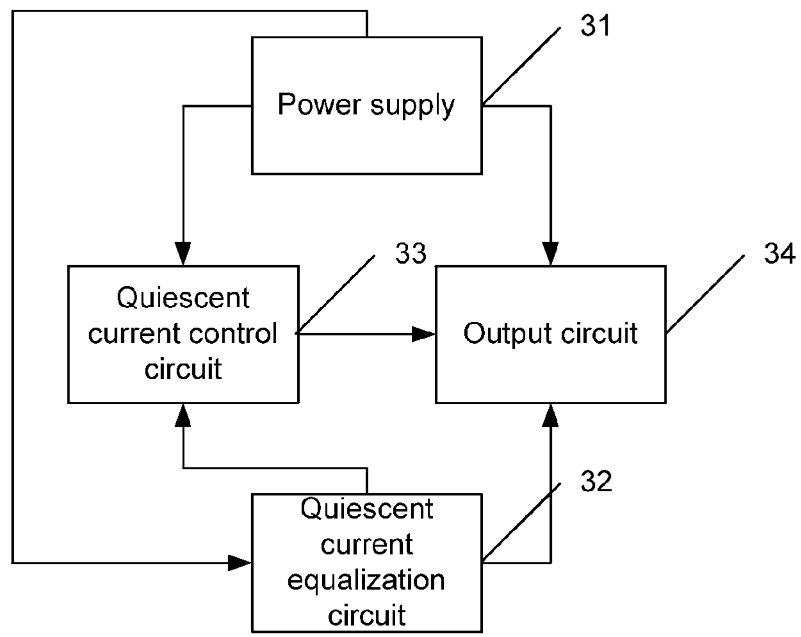
FIG. 3 is a schematic diagram of the structure of an output stage circuit according to the disclosure.

As shown in FIG. 3, the output stage circuit provided in the disclosure comprises a power supply 31, a quiescent current equalization circuit 32, a quiescent current control circuit 33 and an output circuit 34.

The power supply 31 is configured to supply power to the quiescent current control circuit 33 and the output circuit 34;

The quiescent current equalization circuit 32 is configured, when a change of the voltage of the power supply 31 is detected, to decrease or increase the quiescent current flowing through the quiescent current biasing circuit of the quiescent current control circuit 32, such that the quiescent current flowing through the output circuit 34 maintain constant.

The quiescent current control circuit 33 is configured to control the quiescent current of the output circuit 34 and result in a Class AB operation mode.

In this application, "a change of the voltage of the power supply 31 is detected" means that a voltage of the power supply 31 at the current moment which is different from the voltage at the previous moment is detected. In a practical application, "a voltage of the power supply 31 at the current moment which is different from the voltage at the previous moment is detected" means: in the circuit design, it is detected that the difference between the voltage of the power supply 31 at the current moment and that at the previous moment goes beyond an allowable range of variation, i.e. beyond an error range.

Accordingly, in a practical application, "the quiescent current flowing through the output circuit 34 remains constant" means that, in the circuit design of a practical application, the variation of the quiescent current flowing through the output circuit 34 is within an allowed range of variation.

As described above, when a change of the voltage of the power supply 31 is detected, to decrease or increase the quiescent current flowing through the quiescent current biasing circuit of the quiescent current control circuit 32, such that the quiescent current flowing through the output circuit 34 remains constant. Particularly, when a voltage increase of the power supply 31 is detected, the quiescent current flowing through the quiescent current biasing circuit of the quiescent current control circuit 32 is decreased, such that the quiescent current flowing through the output circuit 34 remains constant; when a voltage decrease of the power supply 31 is detected, the quiescent current flowing through the quiescent current biasing circuit of the quiescent current control circuit 32 is increased, such that the quiescent current flowing through the output circuit 34 remains constant.

In the disclosure, the mismatch between the quiescent current flowing through the output circuit 34 and the quiescent current flowing through the quiescent current biasing circuit which is caused by the variation of the drain-source voltage of the output circuit 34 can be offset by decreasing the quiescent current flowing through the quiescent current biasing circuit in the quiescent current control circuit 33, such that the quiescent current flowing through the output circuit 34 remains constant, thereby reducing the dependency of the quiescent current flowing through the output circuit 34 on the voltage of the power supply 31.

The definition "the Class AB operation mode" means that, in the quiescent state, the quiescent current flowing through the output circuit is smaller; while in the dynamic state, a relatively large current can be output to the load and a relatively high output efficiency and a relatively small crossover distortion can be achieved.

The quiescent current equalization circuit 32 decreases or increases the quiescent current flowing through the quiescent current biasing circuit of the quiescent current control circuit 32, such that the quiescent current flowing through the output circuit 34 remains constant. In particular, the quiescent current equalization circuit 32 decreases or increases the quiescent current flowing through itself, such that the quiescent current flowing through the output circuit 34 remains constant.

In the disclosure, by increasing the quiescent current flowing through itself, the quiescent current equalization circuit 32 is capable of decreasing the quiescent current flowing through the quiescent current biasing circuit in the quiescent current control circuit 32; by decreasing the quiescent current flowing through itself, the quiescent current equalization circuit 32 is capable of increasing the quiescent current flowing through the quiescent current biasing circuit in the quiescent current control circuit 32.

By increasing or decreasing the quiescent current flowing through the quiescent current equalization circuit 32, the quiescent current flowing through the quiescent current biasing circuit in the quiescent current control circuit 33 can be decreased or increased, and accordingly, the mismatch between the quiescent current flowing through the output circuit 34 and the quiescent current flowing through the quiescent current biasing circuit which is caused by the variation of the drain-source voltage of the output circuit 34 can be offset, such that the quiescent current flowing through the output circuit 34 remains constant, i.e., in the circuit design, the variation of the quiescent current flowing through the output circuit 34 is within an allowed range of variation, thereby reducing the dependency of the quiescent current flowing through the output circuit on the voltage of the power supply.

Figure 4:
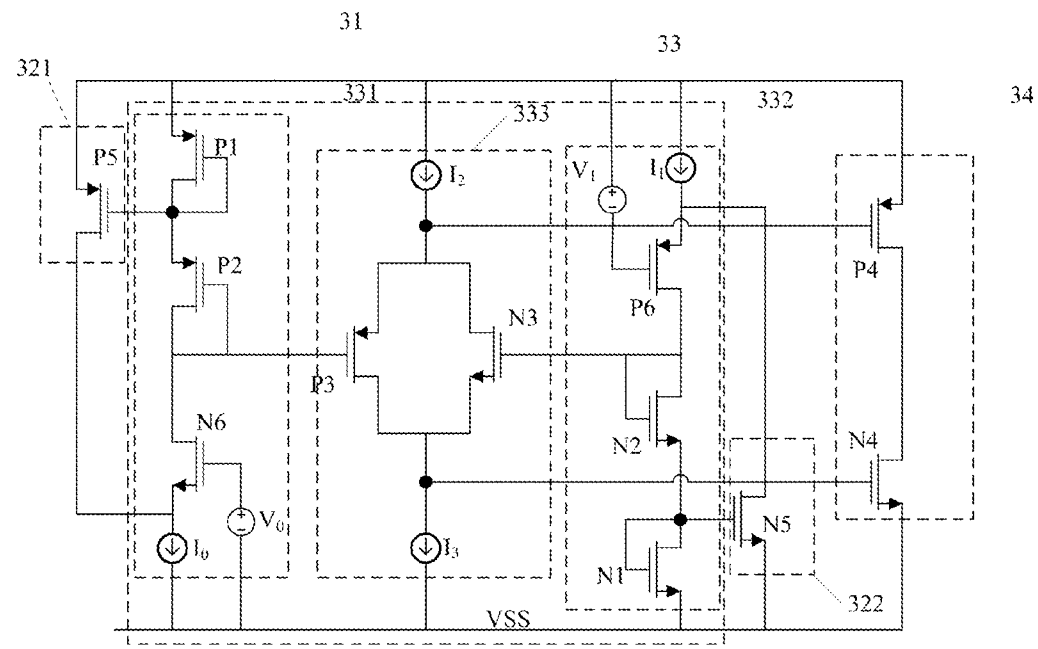
FIG. 4 is a schematic diagram of the structure of the output stage circuit in a practical application according to the disclosure.

The quiescent current control circuit 33 is as shown in FIG. 4. In practical applications, the quiescent current control circuit 33 may further include: a first quiescent current biasing circuit 331, a second quiescent current biasing circuit 332 and a floating voltage biasing circuit 333. The first quiescent current biasing circuit 331 and the second quiescent current biasing circuit 332 form the quiescent current biasing circuit. The first quiescent current biasing circuit 331 may include: a first PMOS P1, a second PMOS P2, a sixth NMOS N6, a first current reference source $I_0$ and a first voltage reference source $V_0$. The second quiescent current biasing circuit 332 may include: a first NMOS N1, a second NMOS N2, a sixth PMOS P6, a second current reference source $I_1$ and a second voltage reference source $V_1$. The floating voltage biasing circuit 333 may include: a third PMOS P3, a third NMOS N3, a third current reference source $I_2$ and the fourth current reference source $I_3$. The first quiescent current biasing circuit 331 and the second quiescent current biasing circuit 332 are configured respectively to bias the quiescent current of the output circuit 34 such that the quiescent current flowing through the output circuit becomes a mirror of the quiescent current flowing itself. The floating voltage biasing circuit 333 is configured to bias the voltage of the output circuit 34.

The quiescent current equalization circuit 32 is as shown in FIG. 4 and may include: a first quiescent current equalization sub-circuit 321 and a second quiescent current equalization sub-circuit 322. The first quiescent current equalization sub-circuit 321 comprises: a fifth PMOS P5, and the second quiescent current equalization sub-circuit 322 comprises: a fifth NMOS N5. In the disclosure, in the circuit design of a practical application, the quiescent current equalization circuit 32 may comprise only the first quiescent current equalization sub-circuit 321, or may comprise only the second quiescent current equalization sub-circuit 322, or may comprise both the first quiescent current equalization sub-circuit 321 and the second quiescent current equalization sub-circuit 322.

As shown in FIG. 4, the output circuit 34 may comprise: a fourth PMPS P4 and a fourth NMOS N4.

The connection relations of the components of the output stage circuit as shown in FIG. 4 are described as follows.

In the first quiescent current biasing circuit 331, both the gate and the drain of the first PMOS P1 are coupled to the gate of the fifth PMOS P5 of first quiescent current equalization sub-circuit 321 and the source of the second PMOS P2; the source of the first PMOS P1 is coupled to the power supply 31; both the gate and the drain of the second PMOS P2 are coupled to the gate of the third PMOS P3 of the floating voltage biasing circuit 333 and the drain of the sixth NMOS N6; the gate of the sixth NMOS N6 is coupled to one end of the first voltage reference source $V_0$, and the source of the sixth NMOS N6 is coupled to the gate of the fifth PMOS P5 in the first quiescent current equalization sub-circuit 321 and one end of the first current reference source $I_0$; the other end of the first current reference source $I_0$ is coupled to a ground point VSS; the other end of the first voltage reference source $V_0$ is coupled to the ground point VSS.

In the second quiescent current biasing circuit 332, both the gate and the drain of the first NMOS N1 are coupled to the gate of the fifth NMOS N5 of the second quiescent current equalization sub-circuit 322 and the source of the second NMOS N2, and the source of the first NMOS N1 is coupled to the ground point VSS; both the gate and drain of the second NMOS N2 are coupled to the gate of the third NMOS P3 in the floating voltage biasing circuit 333 and the drain of the sixth PMOS P6; the gate of the sixth PMOS P6 is coupled to one end of the second voltage reference source $V_1$, and the source of the sixth PMOS P6 is coupled to the drain of the fifth NMOS N5 in the second quiescent current equalization sub-circuit 322 and one end of the second current reference source $I_1$; the other end of the second current reference source $I_1$ is coupled to the power supply 31; the other end of the second voltage reference source $V_0$ is coupled to the power supply 31.

In the floating voltage biasing circuit 333, the source of the third PMOS P3 is coupled to a connection point formed by one end of the third current reference source $I_2$, the drain of the third NMOS N3 and the gate of the fourth PMOS P4 in the output circuit 34; the drain of the third NMOS N3 is coupled to the connection point formed by one end of the fourth current reference source $I_3$, the source of the third NMOS N3 and the gate of the fourth NMOS N4; the other end of the third current reference source $I_2$ is coupled to the power supply 31; the other end of the fourth current reference source $I_3$ is coupled to the ground point VSS.

In the output circuit 34, the source of the fourth PMOS P4 is coupled to the power supply 31, and the drain of the fourth PMOS P4 is coupled to the drain of the fourth NMOS N4; the source of the fourth NMOS N4 is coupled to the ground point VSS.

In the first quiescent current equalization sub-circuit 321, the source of the fifth PMOS P5 is coupled to the powers supply 31.

In the second quiescent current equalization sub-circuit 322, the source of the fifth NMOS N5 is coupled to the ground point VSS.

The operation principle of the first quiescent current equalization sub-circuit 321 will be described below.

When the voltage of the power supply 31 is increased, since $V_{dsP5}+V_{V0}-V_{gsN6}=V_{VCC}$, and $V_{V0}-V_{gsN6}$ is kept essentially constant, $V_{dsP5}$ is increased such that the quiescent current flowing through the fifth PMOS P5 is increased. Additionally, $I_{I0}=I_{P5}+I_{P1}$, and the fifth PMOS P5 and the first PMOS P1 from a current mirror. Accordingly, when the voltage of the power supply 31 is increased, the increase of $I_{P5}$ causes the proportion of $I_{P5}$ in $I_{I0}$ is increased such that the quiescent current flowing through the first PMOS P1 is decreased. In other words, the quiescent current flowing through the first quiescent current biasing circuit 331 is decreased with the increase of the voltage of the power supply 31.

As shown in FIG. 4, $V_{dsP1}=V_{gsP1}$ while $V_{dsP4}$ is dependent on the voltage of the power source 31, which result in a mismatch of the quiescent current flowing through the first PMOS P1 and the quiescent current flowing through the fourth PMOS P4 is present. For this reason, the fifth PMOS is used to offset the effect of the mismatch such that the current of the fourth PMOS P4 remains constant.

As used herein, $V_{dsP5}$ represents the drain-source voltage of the fifth PMOS P5, $V_{V0}$ represents the voltage of the first voltage reference source $V_0$, $V_{gsN6}$ represents the gate-source voltage of the sixth NMOS N6, $V_{VCC}$ represents the voltage of the power supply 31, $V_{gsP1}$ represents the gate-source voltage of the first PMOS P1, $V_{gsP5}$ represents the gate-source voltage of the fifth PMOS P5, $I_{I0}$ represents the current of the first current reference source $I_0$, $I_{P5}$ represents the quiescent current flowing through the fifth PMOS P5, $I_{P1}$ represents the quiescent current flowing through the first PMOS P1, i.e. the quiescent current flowing through the first quiescent current biasing circuit 331, $V_{dsP1}$ represents the drain-source voltage of the first PMOS P1, $V_{dsP4}$ represents the drain-source voltage of the first PMOS P4.

When the voltage of the power supply 31 is decreased, the operation principle of the first quiescent current equalization sub-circuit 321 is reverse to the operation principle thereof when the voltage of the power supply 31 is increased, and therefore, will not be described in detail.

The operation principle of the second quiescent current equalization sub-circuit 322 is the same as the operation principle of the first quiescent current equalization sub-circuit 321, and therefore, will not be described in detail.

Based on the output stage circuit above, the disclosure further provides a quiescent current equalization method which includes steps of decreasing or increasing the quiescent current flowing through the quiescent current biasing circuit in the quiescent current control circuit when a change of the voltage of the power supply is detected, such that the quiescent current flowing through the output circuit remains constant.

In particular, the method includes steps of providing a quiescent current equalization circuit; increasing or decreasing the quiescent current flowing through the quiescent current equalization circuit when a change of the voltage of the power supply is detected, such that the quiescent current flowing through the output circuit remains constant.

Based on the output stage circuit above, the disclosure further provides a Class AB amplifier comprising: an output stage circuit. As shown in FIG. 3, the output stage circuit provided in the disclosure comprises a power supply 31, a quiescent current equalization circuit 32, a quiescent current control circuit 33 and an output circuit 34.

The power supply 31 is configured to supply power to the quiescent current control circuit 33 and the output circuit 34.

The quiescent current equalization circuit 32 is configured, when a change of the voltage of the power supply 31 is detected, to decrease or increase the quiescent current flowing through the quiescent current biasing circuit of the quiescent current control circuit 32, such that the quiescent current flowing through the output circuit 34 remains constant.

The quiescent current control circuit 33 is configured to control the quiescent current of the output circuit 34 and result in a Class AB operation mode.

In this application, "a change of the voltage of the power supply 31 is detected" means that a voltage of the power supply 31 at the current moment which is different from the voltage at the previous moment is detected, wherein, in a practical application, "a voltage of the power supply 31 at the current moment which is different from the voltage at the previous moment is detected" means: in the circuit design, it is detected that the difference between the voltage of the power supply 31 at the current moment and that at the previous moment goes beyond an allowed range of variation, i.e. beyond an error range.

Accordingly, in a practical application, "the quiescent current flowing through the output circuit 34 remains constant" means that, in the circuit design of a practical application, the variation of the quiescent current flowing through the output circuit 34 is within an allowed range of variation.

As described above, when a change of the voltage of the power supply 31 is detected, to decrease or increase the quiescent current flowing through the quiescent current biasing circuit of the quiescent current control circuit 32, such that the quiescent current flowing through the output circuit 34 maintained constant. Particularly, when a voltage increase of the power supply 31 is detected, the quiescent current flowing through the quiescent current biasing circuit of the quiescent current control circuit 32 is decreased, such that the quiescent current flowing through the output circuit 34 remains constant; when a voltage decrease of the power supply 31 is detected, the quiescent current flowing through the quiescent current biasing circuit of the quiescent current control circuit 32 is increased, such that the quiescent current flowing through the output circuit 34 remains constant.

In the disclosure, the mismatch between the quiescent current flowing through the output circuit 34 and the quiescent current flowing through the quiescent current biasing circuit which is caused by the variation of the drain-source voltage of the output circuit 34 can be offset by decreasing the quiescent current flowing through the quiescent current biasing circuit in the quiescent current control circuit 33 such that the quiescent current flowing through the output circuit 34 is maintained constant thereby reducing the dependency of the quiescent current flowing through the output circuit 34 on the voltage of the power supply 31.

The definition "Class AB operation mode" means that, in the quiescent state, the quiescent current flowing through the output circuit is smaller; while in the dynamic state, a relatively large current can be output to the load and a relatively high output efficiency and a relatively small crossover distortion can be achieved.

The quiescent current equalization circuit 32 decreases or increases the quiescent current flowing through the quiescent current biasing circuit of the quiescent current control circuit 32, such that the quiescent current flowing through the output circuit 34 remains constant. In particular, this means: the quiescent current equalization circuit 32 decreases or increases the quiescent current flowing through itself, such that the quiescent current flowing through the output circuit 34 remains constant.

In the disclosure, by increasing the quiescent current flowing through itself, the quiescent current equalization circuit 32 is capable of decreasing the quiescent current flowing through the quiescent current biasing circuit in the quiescent current control circuit 32; by decreasing the quiescent current flowing through itself, the quiescent current equalization circuit 32 is capable of increasing the quiescent current flowing through the quiescent current biasing circuit in the quiescent current control circuit 32.

By increasing or decreasing the quiescent current flowing through the quiescent current equalization circuit 32, the quiescent current flowing through the quiescent current biasing circuit in the quiescent current control circuit 33 can be decreased or increased, and accordingly, the mismatch between the quiescent current flowing through the output circuit 34 and the quiescent current flowing through the quiescent current biasing circuit which is caused by the variation of the drain-source voltage of the output circuit 34 can be offset, such that the quiescent current flowing through the output circuit 34 remains constant, i.e., in the circuit design, the variation of the quiescent current flowing through the output circuit 34 is within an allowed range of variation thereby reducing the dependency of the quiescent current flowing through the output circuit on the voltage of the power supply.

The quiescent current control circuit 33 is as shown in FIG. 4. In practical applications, the quiescent current control circuit 33 may further include: a first quiescent current biasing circuit 331, a second quiescent current biasing circuit 332 and a floating voltage biasing circuit 333. The first quiescent current biasing circuit 331 and the second quiescent current biasing circuit 332 form the quiescent current biasing circuit. The first quiescent current biasing circuit 331 may include: a first PMOS P1, a second PMOS P2, a sixth NMOS N6, a first current reference source $I_0$ and a first voltage reference source $V_0$. The second quiescent current biasing circuit 332 may include: a first NMOS N1, a second NMOS N2, a sixth PMOS P6, a second current reference source $I_1$ and a second voltage reference source $V_1$. The floating voltage biasing circuit 333 may include: a third PMOS P3, a third NMOS N3, a third current reference source $I_2$ and the fourth current reference source $I_3$. The first quiescent current biasing circuit 331 and the second quiescent current biasing circuit 332 are configured respectively to bias the quiescent current of the output circuit 34 such that the quiescent current flowing through the output circuit becomes a mirror of the quiescent current flowing itself. The floating voltage biasing circuit 333 is configured to bias the voltage of the output circuit 34.

The quiescent current equalization circuit 32 is as shown in FIG. 4 and may include: a first quiescent current equalization sub-circuit 321 and a second quiescent current equalization sub-circuit 322. The first quiescent current equalization sub-circuit 321 comprises: a fifth PMOS P5, and the second quiescent current equalization sub-circuit 322 comprises: a fifth NMOS N5. In the disclosure, in the circuit design of a practical application, the quiescent current equalization circuit 32 may comprise only the first quiescent current equalization sub-circuit 321, or may comprise only the second quiescent current equalization sub-circuit 322, or may comprise both the first quiescent current equalization sub-circuit 321 and the second quiescent current equalization sub-circuit 322.

As shown in FIG. 4, the output circuit 34 may comprise: a fourth PMPS P4 and a fourth NMOS N4.

The connection relations of the components of the output stage circuit as shown in FIG. 4 are described as follows.

In the first quiescent current biasing circuit 331, both the gate and the drain of the first PMOS P1 are coupled to the gate of the fifth PMOS P5 of first quiescent current equalization sub-circuit 321 and the source of the second PMOS P2; the source of the first PMOS P1 is coupled to the power supply 31; both the gate and the drain of the second PMOS P2 are coupled to the gate of the third PMOS P3 of the floating voltage biasing circuit 333 and the drain of the sixth NMOS N6; the gate of the sixth NMOS N6 is coupled to one end of the first voltage reference source $V_0$, and the source of the sixth NMOS N6 is coupled to the gate of the fifth PMOS P5 in the first quiescent current equalization sub-circuit 321 and one end of the first current reference source $I_0$; the other end of the first current reference source $I_0$ is coupled to a ground point VSS; the other end of the first voltage reference source $V_0$ is coupled to the ground point VSS.

In the second quiescent current biasing circuit 332, both the gate and the drain of the first NMOS N1 are coupled to the gate of the fifth NMOS N5 of the second quiescent current equalization sub-circuit 322 and the source of the second NMOS N2, and the source of the first NMOS N1 is coupled to the ground point VSS; both the gate and drain of the second NMOS N2 are coupled to the gate of the third NMOS P3 in the floating voltage biasing circuit 333 and the drain of the sixth PMOS P6 ; the gate of the sixth PMOS P6 is coupled to one end of the second voltage reference source $V_1$, and the source of the sixth PMOS P6 is coupled to the drain of the fifth NMOS N5 in the second quiescent current equalization sub-circuit 322 and one end of the second current reference source $I_1$; the other end of the second current reference source $I_1$ is coupled to the power supply 31; the other end of the second voltage reference source $V_0$ is coupled to the power supply 31.

In the floating voltage biasing circuit 333, the source of the third PMOS P3 is coupled to a connection point formed by one end of the third current reference source $I_2$, the drain of the third NMOS N3 and the gate of the fourth PMOS P4 in the output circuit 34; the drain of the third NMOS N3 is coupled to the connection point formed by one end of the fourth current reference source $I_3$, the source of the third NMOS N3 and the gate of the fourth NMOS N4; the other end of the third current reference source $I_2$ is coupled to the power supply 31; the other end of the fourth current reference source $I_3$ is coupled to the ground point VSS.

In the output circuit 34, the source of the fourth PMOS P4 is coupled to the power supply 31, and the drain of the fourth PMOS P4 is coupled to the drain of the fourth NMOS N4; the source of the fourth NMOS N4 is coupled to the ground point VSS.

In the first quiescent current equalization sub-circuit 321, the source of the fifth PMOS P5 is coupled to the powers supply 31.

In the second quiescent current equalization sub-circuit 322, the source of the fifth NMOS N5 is coupled to the ground point VSS.

When the voltage of the power supply 31 is subjected to an increase, the operation principle of the first quiescent current equalization sub-circuit 321 will be described below.

When the voltage of the power supply 31 is increased, since $V_{dsP5}+V_{V0}\ V_{gsN6}=V_{VCC}$, and $V_{V0}-V_{gsN6}$ is kept essentially constant, $V_{dsP5}$ is increased such that the quiescent current flowing through the fifth PMOS P5 is increased. Additionally, $I_{I0}=I_{P5}+I_{P1}$, and the fifth PMOS P5 and the first PMOS P1 form a current mirror. Accordingly, when the voltage of the power supply 31 is increased, the increase of $I_{P5}$ causes the proportion of $I_{P5}$ in $I_{I0}$ is increased such that the quiescent current flowing through the first PMOS P1 is decreased. In other words, the quiescent current flowing through the first quiescent current biasing circuit 331 is decreased with the increase of the voltage of the power supply 31.

As shown in FIG. 4, $V_{dsP1}=V_{gsP1}$ while $V_{dsP4}$ is dependent on the voltage of the power source 31, which result in a mismatch of the quiescent current flowing through the first PMOS P1 and the quiescent current flowing through the fourth PMOS P4 is present. For this reason, the fifth PMOS is used to offset the effect of the mismatch such that the current of the fourth PMOS P4 remains constant.

As used herein, $V_{dsP5}$ represents the drain-source voltage of the fifth PMOS P5, $V_{V0}$ represents the voltage of the first voltage reference source $V_0$, $V_{gsN6}$ represents the gate-source voltage of the sixth NMOS N6, $V_{VCC}$ represents the voltage of the power supply 31, $V_{gsP1}$ represents the gate-source voltage of the first PMOS P1, $V_{gsP5}$ represents the gate-source voltage of the fifth PMOS P5 , $I_{I0}$ represents the current of the first current reference source $I_0$, $I_{P5}$ represents the quiescent current flowing through the fifth PMOS P5, $I_{P1}$ represents the quiescent current flowing through the first PMOS P1, i.e. the quiescent current flowing through the first quiescent current biasing circuit 331, $V_{dsP1}$ represents the drain-source voltage of the first PMOS P1, $V_{dsP4}$ represents the drain-source voltage of the first PMOS P4.

When the voltage of the power supply 31 is decreased, the operation principle of the first quiescent current equalization sub-circuit 321 is reverse to the operation principle thereof when the voltage of the power supply 31 is increased, and therefore, will not be described in detail.

The operation principle of the second quiescent current equalization sub-circuit 322 is the same as the operation principle of the first quiescent current equalization sub-circuit 321, and therefore, will not be described in detail.

Based on the Class AB amplifier as described above, the disclosure further provides an electronic device comprising: a motherboard, a casing and a Class AB amplifier; the Class AB amplifier comprises an output stage circuit. As shown in FIG. 3, the output stage circuit provided in the disclosure comprises a power supply 31, a quiescent current equalization circuit 32, a quiescent current control circuit 33 and an output circuit 34.

The power supply 31 is configured to supply power to the quiescent current control circuit 33 and the output circuit 34.

The quiescent current equalization circuit 32 is configured, when a change of the voltage of the power supply 31 is detected, to decrease or increase the quiescent current flowing through the quiescent current biasing circuit of the quiescent current control circuit 32, such that the quiescent current flowing through the output circuit 34 remains constant.

The quiescent current control circuit 33 is configured to control the quiescent current of the output circuit 34 and result in a Class AB operation mode.

In this application, "a change of the voltage of the power supply 31 is detected" means that a voltage of the power supply 31 at the current moment which is different from the voltage at the previous moment is detected, wherein, in a practical application, "a voltage of the power supply 31 at the current moment which is different from the voltage at the previous moment is detected" means: in the circuit design, it is detected that the difference between the voltage of the power supply 31 at the current moment and that at the previous moment goes beyond an allowed range of variation, i.e. beyond an error range.

Accordingly, in a practical application, "the quiescent current flowing through the output circuit 34 remains constant" means that, in the circuit design of a practical application, the variation of the quiescent current flowing through the output circuit 34 is within an allowed range of variation.

As described above, when a change of the voltage of the power supply 31 is detected, to decrease or increase the quiescent current flowing through the quiescent current biasing circuit of the quiescent current control circuit 32, such that the quiescent current flowing through the output circuit 34 maintained constant. Particularly, when a voltage increase of the power supply 31 is detected, the quiescent current flowing through the quiescent current biasing circuit of the quiescent current control circuit 32 is decreased, such that the quiescent current flowing through the output circuit 34 remains constant; when a voltage decrease of the power supply 31 is detected, the quiescent current flowing through the quiescent current biasing circuit of the quiescent current control circuit 32 is increased, such that the quiescent current flowing through the output circuit 34 remains constant.

In the disclosure, the mismatch between the quiescent current flowing through the output circuit 34 and the quiescent current flowing through the quiescent current biasing circuit which is caused by the variation of the drain-source voltage of the output circuit 34 can be offset by decreasing the quiescent current flowing through the quiescent current biasing circuit in the quiescent current control circuit 33 such that the quiescent current flowing through the output circuit 34 is maintained constant thereby reducing the dependency of the quiescent current flowing through the output circuit 34 on the voltage of the power supply 31.

The definition "Class AB operation mode" means that, in the quiescent state, the quiescent current flowing through the output circuit is smaller; while in the dynamic state, a relatively large current can be output to the load and a relatively high output efficiency and a relatively small crossover distortion can be achieved.

The quiescent current equalization circuit 32 decreases or increases the quiescent current flowing through the quiescent current biasing circuit of the quiescent current control circuit 32, such that the quiescent current flowing through the output circuit 34 maintained constant. In particular, this means: decreases or increases the quiescent current flowing through itself, such that the quiescent current flowing through the output circuit 34 maintained constant.

In the disclosure, by increasing the quiescent current flowing through itself, the quiescent current equalization circuit 32 is capable of decreasing the quiescent current flowing through the quiescent current biasing circuit in the quiescent current control circuit 32; by decreasing the quiescent current flowing through itself, the quiescent current equalization circuit 32 is capable of increasing the quiescent current flowing through the quiescent current biasing circuit in the quiescent current control circuit 32.

By increasing or decreasing the quiescent current flowing through the quiescent current equalization circuit 32, the quiescent current flowing through the quiescent current biasing circuit in the quiescent current control circuit 33 can be decreased or increased, and accordingly, the mismatch between the quiescent current flowing through the output circuit 34 and the quiescent current flowing through the quiescent current biasing circuit which is caused by the variation of the drain-source voltage of the output circuit 34 can be offset such that the quiescent current flowing through the output circuit 34 remains constant, i.e., in the circuit design, the variation of the quiescent current flowing through the output circuit 34 is within an allowed range of variation thereby reducing the dependency of the quiescent current flowing through the output circuit on the voltage of the power supply.

The quiescent current control circuit 33 is as shown in FIG. 4. In practical applications, the quiescent current control circuit 33 may further include: a first quiescent current biasing circuit 331, a second quiescent current biasing circuit 332 and a floating voltage biasing circuit 333. The first quiescent current biasing circuit 331 and the second quiescent current biasing circuit 332 form the quiescent current biasing circuit. The first quiescent current biasing circuit 331 may include: a first PMOS P1, a second PMOS P2, a sixth NMOS N6, a first current reference source $I_0$ and a first voltage reference source $V_0$. The second quiescent current biasing circuit 332 may include: a first NMOS N1, a second NMOS N2, a sixth PMOS P6, a second current reference source $I_1$ and a second voltage reference source $V_1$. The floating voltage biasing circuit 333 may include: a third PMOS P3, a third NMOS N3, a third current reference source $I_2$ and the fourth current reference source $I_3$. The first quiescent current biasing circuit 331 and the second quiescent current biasing circuit 332 are configured respectively to bias the quiescent current of the output circuit 34 such that the quiescent current flowing through the output circuit becomes a mirror of the quiescent current flowing itself. The floating voltage biasing circuit 333 is configured to bias the voltage of the output circuit 34.

The quiescent current equalization circuit 32 is as shown in FIG. 4 and may include: a first quiescent current equalization sub-circuit 321 and a second quiescent current equalization sub-circuit 322. The first quiescent current equalization sub-circuit 321 comprises: a fifth PMOS P5, and the second quiescent current equalization sub-circuit 322 comprises: a fifth NMOS N5. In the disclosure, in the circuit design of a practical application, the quiescent current equalization circuit 32 may comprise only the first quiescent current equalization sub-circuit 321, or may comprise only the second quiescent current equalization sub-circuit 322, or may comprise both the first quiescent current equalization sub-circuit 321 and the second quiescent current equalization sub-circuit 322.

As shown in FIG. 4, the output circuit 34 may comprise: a fourth PMPS P4 and a fourth NMOS N4.

The connection relations of the components of the output stage circuit as shown in FIG. 4 are described as follows:

In the first quiescent current biasing circuit 331, both the gate and the drain of the first PMOS P1 are coupled to the gate of the fifth PMOS P5 of first quiescent current equalization sub-circuit 321 and the source of the second PMOS P2; the source of the first PMOS P1 is coupled to the power supply 31; both the gate and the drain of the second PMOS P2 are coupled to the gate of the third PMOS P3 of the floating voltage biasing circuit 333 and the drain of the sixth NMOS N6; the gate of the sixth NMOS N6 is coupled to one end of the first voltage reference source $V_0$, and the source of the sixth NMOS N6 is coupled to the gate of the fifth PMOS P5 in the first quiescent current equalization sub-circuit 321 and one end of the first current reference source $I_0$; the other end of the first current reference source $I_0$ is coupled to a ground point VSS; the other end of the first voltage reference source $V_0$ is coupled to the ground point VSS.

In the second quiescent current biasing circuit 332, both the gate and the drain of the first NMOS N1 are coupled to the gate of the fifth NMOS N5 of the second quiescent current equalization sub-circuit 322 and the source of the second NMOS N2, and the source of the first NMOS N1 is coupled to the ground point VSS; both the gate and drain of the second NMOS N2 are coupled to the gate of the third NMOS P3 in the floating voltage biasing circuit 333 and the drain of the sixth PMOS P6; the gate of the sixth PMOS P6 is coupled to one end of the second voltage reference source $V_1$, and the source of the sixth PMOS P6 is coupled to the drain of the fifth NMOS N5 in the second quiescent current equalization sub-circuit 322 and one end of the second current reference source $I_1$; the other end of the second current reference source $I_1$ is coupled to the power supply 31; the other end of the second voltage reference source $V_0$ is coupled to the power supply 31.

In the floating voltage biasing circuit 333, the source of the third PMOS P3 is coupled to a connection point formed by one end of the third current reference source $I_2$, the drain of the third NMOS N3 and the gate of the fourth PMOS P4 in the output circuit 34; the drain of the third NMOS N3 is coupled to the connection point formed by one end of the fourth current reference source $I_3$, the source of the third NMOS N3 and the gate of the fourth NMOS N4; the other end of the third current reference source $I_2$ is coupled to the power supply 31; the other end of the fourth current reference source $I_3$ is coupled to the ground point VSS.

In the output circuit 34, the source of the fourth PMOS P4 is coupled to the power supply 31, and the drain of the fourth PMOS P4 is coupled to the drain of the fourth NMOS N4; the source of the fourth NMOS N4 is coupled to the ground point VSS.

In the first quiescent current equalization sub-circuit 321, the source of the fifth PMOS P5 is coupled to the powers supply 31.

In the second quiescent current equalization sub-circuit 322, the source of the fifth NMOS N5 is coupled to the ground point VSS.

When the voltage of the power supply 31 is subjected to an increase, the operation principle of the first quiescent current equalization sub-circuit 321 will be described below.

When the voltage of the power supply 31 is increased, since $V_{dsP5}+V_{V0}-V_{gsN6}=V_{VCC}$, and $V_{V0}-V_{gsN6}$ is kept essentially constant, $V_{dsP5}$ is increased such that the quiescent current flowing through the fifth PMOS P5 is increased. Additionally, $I_{I0}=I_{P5}+I_{P1}$, and the fifth PMOS P5 and the first PMOS P1 from a current mirror. Accordingly, when the voltage of the power supply 31 is increased, the increase of $I_{P5}$ causes the proportion of $I_{P5}$ in $I_{I0}$ is increased such that the quiescent current flowing through the first PMOS P1 is decreased. In other words, the quiescent current flowing through the first quiescent current biasing circuit 331 is decreased with the increase of the voltage of the power supply 31.

As shown in FIG. 4, $V_{dsP1}=V_{gsP1}$ while $V_{dsP4}$ is dependent on the voltage of the power source 31, which result in a mismatch of the quiescent current flowing through the first PMOS P1 and the quiescent current flowing through the fourth PMOS P4 is present. For this reason, the fifth PMOS is used to offset the effect of the mismatch such that the current of the fourth PMOS P4 remains constant.

As used herein, $V_{dsp5}$ represents the drain-source voltage of the fifth PMOS P5, $V_{V0}$ represents the voltage of the first voltage reference source $V_0$, $V_{gsN6}$ represents the gate-source voltage of the sixth NMOS N6, $V_{VCC}$ represents the voltage of the power supply 31, $V_{gsP1}$ represents the gate-source voltage of the first PMOS P1, $V_{gsP5}$ represents the gate-source voltage of the fifth PMOS P5, $I_{I0}$ represents the current of the first current reference source $I_0$, $I_{P5}$ represents the quiescent current flowing through the fifth PMOS P5, $I_{P1}$ represents the quiescent current flowing through the first PMOS P1, i.e. the quiescent current flowing through the first quiescent current biasing circuit 331, $V_{dsp1}$ represents the drain-source voltage of the first PMOS P1, $V_{dsP4}$ represents the drain-source voltage of the first PMOS P4.

When the voltage of the power supply 31 is decreased, the operation principle of the first quiescent current equalization sub-circuit 321 is reverse to the operation principle thereof when the voltage of the power supply 31 is increased, and therefore, will not be described in detail.

The operation principle of the second quiescent current equalization sub-circuit 322 is the same as the operation principle of the first quiescent current equalization sub-circuit 321, and therefore, will not be described in detail.

As used herein, the electronic devices may be a mobile phone, an iPad, a laptop, and the like.

Figure 5:
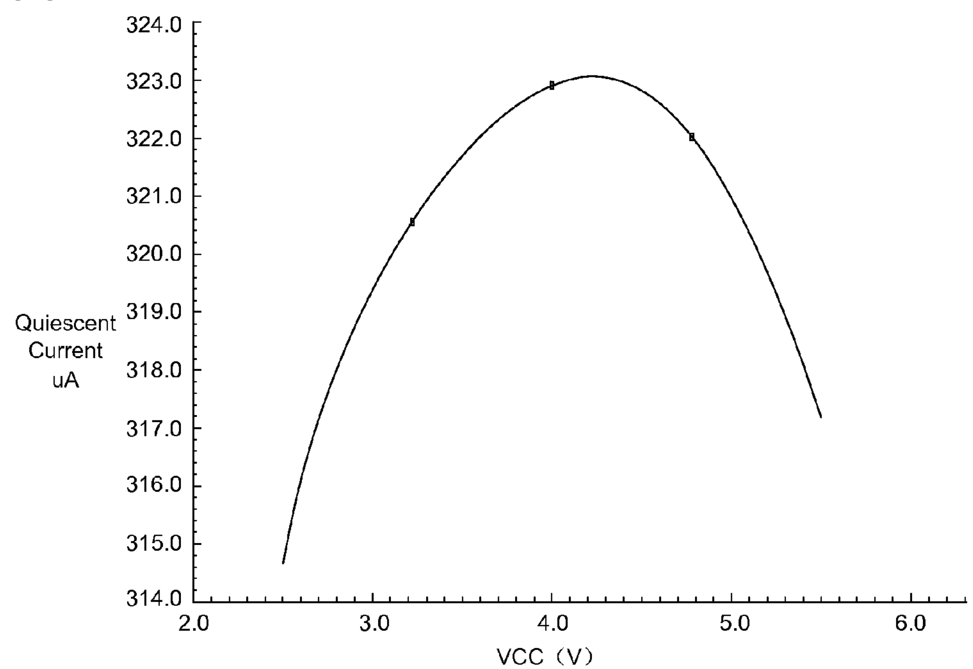
FIG. 5 is a schematic diagram of the simulation result of the technical solution according to the disclosure.

FIG. 5 is a graph illustrating the results obtained from a simulation of the technical solution of the disclosure. The results show: with the technical solution of the disclosure, when the voltage of the power supply is increased from 2.5 V to 5.5 V, the quiescent current flowing through the output circuit is changed between 315 μA and 324 μA, and the rate of change is 3%.

Furthermore, for the purpose of demonstrating that, with the technical solution of the disclosure, the quiescent current flowing through the output circuit would not change with the voltage of the power supply, six integrated circuits which are numbered respectively as 1, 2, 3, 4, 5, 6 were prepared using the technical solution of the disclosure, and the quiescent currents flowing through the output circuits of the integrated circuits were measured at 25° C. The results are shown in Table 1.

TABLE 1

| Power Supply | Current (mA) | | | | | |
|---|---|---|---|---|---|---|
| (Voltage) | 1 | 2 | 3 | 4 | 5 | 6 |
| 2.7 V | 1.143 | 1.134 | 1.127 | 1.121 | 1.121 | 1.134 |
| 3.3 V | 1.143 | 1.14 | 1.132 | 1.125 | 1.127 | 1.139 |
| 5.0 V | 1.144 | 1.137 | 1.129 | 1.119 | 1.124 | 1.135 |
| 5.5 V | 1.142 | 1.135 | 1.128 | 1.117 | 1.122 | 1.134 |

It can be seen from Table 1 that, with respect to each integrated circuit, in the process that the voltage of the power supply was increased from 2.7 V to 5.5 V, the variation of the quiescent current flowing through the output circuit of each of the integrated circuit was only several microamperes, which indicates that the measurement results were of a very good repeatability. Additionally, with the technical solution of the disclosure, the quiescent current flowing through the output circuit of each of the integrated circuits substantially does not change with the voltage of the power supply.

The description above is only for the preferred embodiments of the disclosure, but not intended to limit the scope thereof.

What is claimed is:

1. An output stage circuit, comprising:
a power supply;
a quiescent current control circuit;
an output circuit; and
a quiescent current equalization circuit to decrease or increase a quiescent current flowing through a quiescent current biasing circuit in the quiescent current control circuit when a change of a voltage of the power supply is detected, such that a quiescent current flowing through the output circuit remains constant, the quiescent current equalization circuit comprising:
a first quiescent biasing circuit including a first P-channel Metal Oxide Semiconductor Transistor (PMOS), a second PMOS, a sixth N-channel Metal Oxide Semiconductor Transistor (NMOS), a first current reference source and a first voltage reference source;
a floating voltage biasing circuit including a third PMOS, a third NMOS, a third current reference source and a fourth current reference source;
a first quiescent current equalization sub-circuit including a fifth PMOS;
wherein in the first quiescent current biasing circuit, both a gate and a drain of the first PMOS are coupled to a gate of the fifth PMOS in the first quiescent current equalization sub-circuit and a source of the second PMOS;
a source of the first PMOS is coupled to the power supply;
both a gate and a drain of the second PMOS are coupled to a drain of the sixth NMOS and a gate of the third PMOS in the floating voltage biasing circuit;
a gate of the sixth NMOS is coupled to one end of the first voltage reference source, and a source of the sixth NMOS is coupled to one end of the first current reference source and a drain of the fifth PMOS in the first quiescent current equalization sub-circuit;
another end of the first current reference source is coupled to a ground point; and
another end of the first voltage reference source is coupled to the ground point.

2. The output stage circuit according to claim 1, wherein the quiescent current equalization circuit is configured to decrease or increase a quiescent current flowing through the quiescent current equalization circuit when a change of the voltage of the power supply is detected, such that the quiescent current flowing through the output circuit remains constant.

3. The output stage circuit according to claim 1, wherein the quiescent current control circuit further comprises:
a second quiescent current biasing circuit including a first NMOS, a second NMOS, a sixth PMOS, a second current reference source and a second voltage reference source; and a second quiescent current equalization sub-circuit including a fifth NMOS.

4. The output stage circuit according to claim 3, wherein the output circuit comprises a fourth PMOS and a fourth NMOS.

5. The output stage circuit according to claim 4, in the second quiescent current biasing circuit, both a gate and a drain of the first NMOS are coupled to a gate of the fifth NMOS in the second quiescent current equalization sub-circuit and a source of the second NMOS, and a source of the first NMOS is coupled to the ground point;

both a gate and a drain of the second NMOS are coupled to a drain of the sixth PMOS and a gate of the third NMOS in the floating voltage biasing circuit;

a gate of the sixth PMOS is coupled to one end of the second voltage reference source, and a source of the sixth PMOS is coupled to one end of the second current reference source and a drain of the fifth NMOS in the second quiescent current equalization sub-circuit;

another end of the second current reference source is coupled to the power supply;

another end of the second voltage reference source is coupled to the power supply;

wherein in the floating voltage biasing circuit, a source of the third PMOS is coupled to a connection point formed by one end of the third current reference source, a drain of the third NMOS and a gate of the fourth PMOS in the output circuit;

a drain of the third PMOS is coupled to the connection point formed by one end of the fourth current reference source, a source of the third NMOS and a gate of the fourth NMOS in the output circuit;

the other end of the third current reference source is coupled to the power supply;

the other end of the fourth current reference source is coupled to the ground point;

wherein in the output circuit, a source of the fourth PMOS is coupled to the power supply, and a drain of the fourth PMOS is coupled to a drain of the fourth NMOS;

a source of the fourth NMOS is coupled to the ground point;

wherein in the first quiescent current equalization sub-circuit, a source of the fifth PMOS is coupled to the power supply; and wherein in the second quiescent current equalization sub-circuit, a source of the fifth NMOS is coupled to the ground point.

6. A Class AB amplifier comprising an output stage circuit, the output stage circuit comprising:

a power supply;

a quiescent current control circuit;

an output circuit; and a quiescent current equalization circuit to decrease or increase a quiescent current flowing through a quiescent current biasing circuit in the quiescent current control circuit when a change of a voltage of the power supply is detected, such that a quiescent current flowing through the output circuit remains constant, the quiescent current equalization circuit comprising:

a first quiescent biasing circuit including a first P-channel Metal Oxide Semiconductor Transistor (PMOS), a second PMOS, a sixth N-channel Metal Oxide Semiconductor Transistor (NMOS), a first current reference source and a first voltage reference source;

a floating voltage biasing circuit including a third PMOS, a third NMOS, a third current reference source and a fourth current reference source;

a first quiescent current equalization sub-circuit including a fifth PMOS;

wherein in the first quiescent current biasing circuit, both a gate and a drain of the first PMOS are coupled to a gate of the fifth PMOS in the first quiescent current equalization sub-circuit and a source of the second PMOS;

a source of the first PMOS is coupled to the power supply;

both a gate and a drain of the second PMOS are coupled to a drain of the sixth NMOS and a gate of the third PMOS in the floating voltage biasing circuit;

a gate of the sixth NMOS is coupled to one end of the first voltage reference source, and a source of the sixth NMOS is coupled to one end of the first current reference source and a drain of the fifth PMOS in the first quiescent current equalization sub-circuit; and another end of the first current reference source is coupled to a ground point; and another end of the first voltage reference source is coupled to the ground point.

7. The Class AB amplifier according to claim 6, wherein the quiescent current equalization circuit is configured to decrease or increase a quiescent current flowing through the quiescent current equalization circuit when a change of the voltage of the power supply is detected, such that the quiescent current flowing through the output circuit remains constant.

8. The Class AB amplifier according to claim 6, wherein the quiescent current control circuit further comprises:

a second quiescent current biasing circuit including a first NMOS, a second NMOS, a sixth PMOS, a second current reference source and a second voltage reference source; and a second quiescent current equalization sub-circuit including a fifth NMOS.

9. The Class AB amplifier according to claim 8, wherein the output circuit comprises a fourth PMOS and a fourth NMOS.

10. The Class AB amplifier according to claim 9, wherein in the second quiescent current biasing circuit, both a gate and a drain of the first NMOS are coupled to a gate of the fifth NMOS in the second quiescent current equalization sub-circuit and a source of the second NMOS, and a source of the first NMOS is coupled to the ground point;

both a gate and a drain of the second NMOS are coupled to a drain of the sixth PMOS and a gate of the third NMOS in the floating voltage biasing circuit; a gate of the sixth PMOS is coupled to one end of the second voltage reference source, and a source of the sixth PMOS is coupled to one end of the second current reference source and a drain of the fifth NMOS in the second quiescent current equalization sub-circuit;

another end of the second current reference source is coupled to the power supply;

another end of the second voltage reference source is coupled to the power supply;

wherein in the floating voltage biasing circuit, a source of the third PMOS is coupled to a connection point formed by one end of the third current reference source, a drain of the third NMOS and a gate of the fourth PMOS in the output circuit;

a drain of the third PMOS is coupled to the connection point formed by one end of the fourth current reference source, a source of the third NMOS and a gate of the fourth NMOS in the output circuit;

the other end of the third current reference source is coupled to the power supply;

the other end of the fourth current reference source is coupled to the ground point;

wherein in the output circuit, a source of the fourth PMOS is coupled to the power supply, and a drain of the fourth PMOS is coupled to a drain of the fourth NMOS;

a source of the fourth NMOS is coupled to the ground point;

wherein in the first quiescent current equalization sub-circuit, a source of the fifth PMOS is coupled to the power supply; and wherein in the second quiescent current equalization sub-circuit, a source of the fifth NMOS is coupled to the ground point.

11. An electronic device comprising:

a motherboard;

a casing; and a Class AB amplifier comprising an output stage circuit, the output stage circuit comprising:

a power supply;

a quiescent current control circuit;

an output circuit; and a quiescent current equalization circuit to decrease or increase a quiescent current flowing through a quiescent current biasing circuit in the quiescent current control circuit when a change of a voltage of the power supply is detected, such that a quiescent current flowing through the output circuit remains constant, the quiescent current equalization circuit comprising:

a first quiescent biasing circuit including a first P-channel Metal Oxide Semiconductor Transistor (PMOS), a second PMOS, a sixth N-channel Metal Oxide Semiconductor Transistor (NMOS), a first current reference source and a first voltage reference source;

a floating voltage biasing circuit including a third PMOS, a third NMOS, a third current reference source and a fourth current reference source;

a first quiescent current equalization sub-circuit including a fifth PMOS;

wherein in the first quiescent current biasing circuit, both a gate and a drain of the first PMOS are coupled to a gate of the fifth PMOS in the first quiescent current equalization sub-circuit and a source of the second PMOS;

a source of the first PMOS is coupled to the power supply;

both a gate and a drain of the second PMOS are coupled to a drain of the sixth NMOS and a gate of the third PMOS in the floating voltage biasing circuit;

a gate of the sixth NMOS is coupled to one end of the first voltage reference source, and a source of the sixth NMOS is coupled to one end of the first current reference source and a drain of the fifth PMOS in the first quiescent current equalization sub-circuit; and another end of the first current reference source is coupled to a ground point; and another end of the first voltage reference source is coupled to the ground point.

12. The electronic device according to claim 11, wherein the quiescent current equalization circuit is configured to decrease or increase a quiescent current flowing through the quiescent current equalization circuit when a change of the voltage of the power supply is detected, such that the quiescent current flowing through the output circuit remains constant.

13. The electronic device according to claim 11, wherein the quiescent current control circuit further comprises:

a second quiescent current biasing circuit including a first NMOS, a second NMOS, a sixth PMOS, a second current reference source and a second voltage reference source; and a second quiescent current equalization sub-circuit including a fifth NMOS.

14. The electronic device according to claim 13, wherein the output circuit comprises a fourth PMOS and a fourth NMOS.

15. The electronic device according to claim 14, wherein in the second quiescent current biasing circuit, both a gate and a drain of the first NMOS are coupled to a gate of the fifth NMOS in the second quiescent current equalization sub-circuit and a source of the second NMOS, and a source of the first NMOS is coupled to the ground point;

both a gate and a drain of the second NMOS are coupled to a drain of the sixth PMOS and a gate of the third NMOS in the floating voltage biasing circuit;

a gate of the sixth PMOS is coupled to one end of the second voltage reference source, and a source of the sixth PMOS is coupled to one end of the second current reference source and a drain of the fifth NMOS in the second quiescent current equalization sub-circuit;

another end of the second current reference source is coupled to the power supply;

another end of the second voltage reference source is coupled to the power supply;

wherein in the floating voltage biasing circuit, a source of the third PMOS is coupled to a connection point formed by one end of the third current reference source, a drain of the third NMOS and a gate of the fourth PMOS in the output circuit;

a drain of the third PMOS is coupled to the connection point formed by one end of the fourth current reference source, a source of the third NMOS and a gate of the fourth NMOS in the output circuit;

the other end of the third current reference source is coupled to the power supply;

the other end of the fourth current reference source is coupled to the ground point;

wherein in the output circuit, a source of the fourth PMOS is coupled to the power supply, and a drain of the fourth PMOS is coupled to a drain of the fourth NMOS;

a source of the fourth NMOS is coupled to the ground point;

wherein in the first quiescent current equalization sub-circuit, a source of the fifth PMOS is coupled to the power supply; and wherein in the second quiescent current equalization sub-circuit, a source of the fifth NMOS is coupled to the ground point.

* * * * *

UNITED STATES PATENT AND TRADEMARK OFFICE

CERTIFICATE OF CORRECTION

PATENT NO. : 9,350,304 B2
APPLICATION NO. : 14/315663
DATED : May 24, 2016
INVENTOR(S) : Lei Huang et al.

It is certified that error appears in the above-identified patent and that said Letters Patent is hereby corrected as shown below:

In the Claims

In Column 17, line 5, in Claim 5, before "in" insert -- wherein --.

Signed and Sealed this
Second Day of August, 2016

Michelle K. Lee
*Director of the United States Patent and Trademark Office*